United States Patent
Grandclerc et al.

(10) Patent No.: US 11,330,691 B2
(45) Date of Patent: May 10, 2022

(54) DISPLAY COMPRISING A LIGHT SENSOR

(71) Applicant: VALEO COMFORT AND DRIVING ASSISTANCE, Créteil (FR)

(72) Inventors: François Grandclerc, Créteil (FR); Pierre Mermillod, Créteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 398 days.

(21) Appl. No.: 16/096,867

(22) PCT Filed: Apr. 25, 2017

(86) PCT No.: PCT/EP2017/059837
§ 371 (c)(1),
(2) Date: Sep. 8, 2020

(87) PCT Pub. No.: WO2017/186745
PCT Pub. Date: Nov. 2, 2017

(65) Prior Publication Data
US 2020/0413516 A1    Dec. 31, 2020

(30) Foreign Application Priority Data

Apr. 26, 2016 (FR) .................................. 1653673

(51) Int. Cl.
*H05B 47/105*    (2020.01)
*G09G 3/34*    (2006.01)
(Continued)

(52) U.S. Cl.
CPC ......... *H05B 47/105* (2020.01); *G09G 3/3406* (2013.01); *B60K 35/00* (2013.01); *G02B 27/0101* (2013.01)

(58) Field of Classification Search
CPC .................. G09G 3/3406; B60K 35/00; G02B 2027/0118; G02B 27/0101; H05K 1/0274; H05B 47/105
See application file for complete search history.

(56) References Cited

U.S. PATENT DOCUMENTS

2015/0035725 A1* 2/2015 Kawaguchi ............ G09G 3/002
345/7
2015/0085332 A1* 3/2015 Yoshida ............... G03H 1/2294
359/13
(Continued)

FOREIGN PATENT DOCUMENTS

EP    2 849 175 A1    3/2015
JP    H06-144081 A    5/1994
(Continued)

OTHER PUBLICATIONS

International Search Report issued in PCT/EP2017/059837 dated Jul. 6, 2017 (2 pages).
(Continued)

*Primary Examiner* — Muhammad N Edun
(74) *Attorney, Agent, or Firm* — Osha Bergman Watanabe & Burton LLP

(57) ABSTRACT

The invention relates to a display (1) comprising—a casing (10), —an image generation unit (20), and—a light sensor (30), disposed in the interior (INT) of said casing (10), suitable for delivering a signal representative of a light intensity received by same, the display (1) being adapted such that the luminosity of an image generated by the image generation unit (20) is controlled as a function of said signal. According to the invention, the display (1) further comprises a light guide (50) situated in the interior (INT) of the casing (10) of the display (1), having an inlet face (51) and being shaped to collect at the input face (51) of same a light ray
(Continued)

Figure 1:
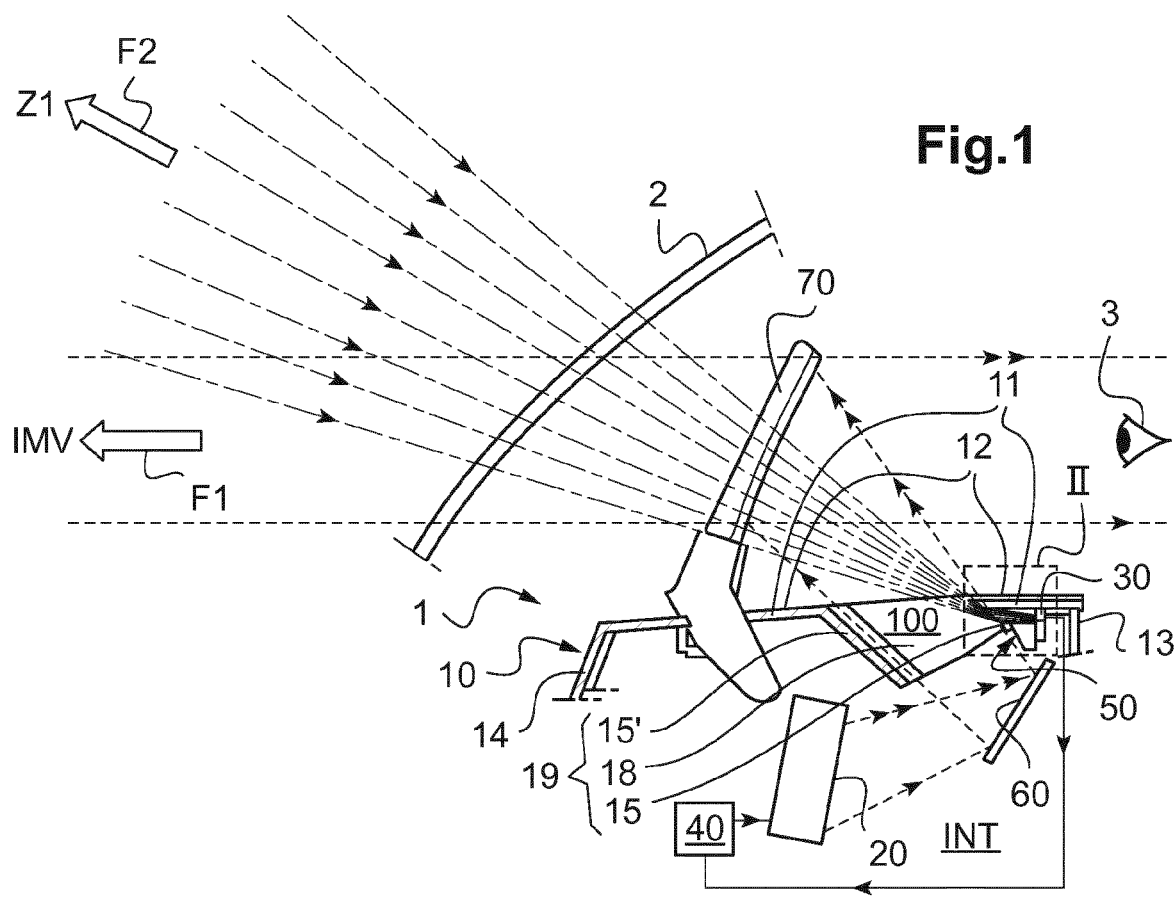

coming from outside the casing (10) of the display, and for guiding said light ray to said sensor (30).

13 Claims, 1 Drawing Sheet

(51) Int. Cl.
*B60K 35/00* (2006.01)
*G02B 27/01* (2006.01)

(56) References Cited

U.S. PATENT DOCUMENTS

2015/0116192 A1* 4/2015 Yachida ................. H05B 47/11
　　　　　　　　　　　　　　　　　　　　　345/84
2016/0178900 A1* 6/2016 Kawaguchi ........ G02B 27/0149
　　　　　　　　　　　　　　　　　　　　　250/215

FOREIGN PATENT DOCUMENTS

| JP | H06-47027 U | 6/1994 |
| JP | 2004-314860 A | 11/2004 |
| JP | 2011-223238 A | 11/2011 |

OTHER PUBLICATIONS

Written Opinion of the International Searching Authority issued in PCT/EP2017/059837 dated Jul. 6, 2017 (6 pages).

* cited by examiner

DISPLAY COMPRISING A LIGHT SENSOR

TECHNICAL FIELD OF THE INVENTION

The present invention relates to a display, in particular to a head-up display.

It more particularly relates to a display comprising:
- a housing;
- an image generation unit; and
- a light sensor, arranged inside said housing, suitable for delivering a signal that is representative of a luminous intensity that it receives;

the display being designed such that the luminosity of an image generated by the image generation unit is controlled according to said signal.

It applies particularly advantageously to a motor vehicle.

TECHNOLOGICAL BACKGROUND

For the driver of a motor vehicle, it is particularly helpful to be able to view information relating to the operation of the vehicle, to traffic conditions and so on without having to avert his or her gaze from the road in front of the vehicle in order to do so.

In this regard, it is known practice to fit a motor vehicle with a head-up display. In such a display, an image including the information to be displayed is generated by an image generation unit. This image is then superposed visually over the environment in front of the vehicle by means of partial reflection off a semitransparent plate located in front of the driver, such as a combiner positioned between the windshield of the vehicle and the eyes of the driver.

In order for the information displayed in this way to be bright enough to be viewed correctly, without however risking dazzling the driver, it is necessary to match the luminosity of the image thus superposed over the environment outside the vehicle to the luminosity of this environment itself, which varies greatly between driving in the daytime and driving at night or through a tunnel.

In this regard, it is known practice to provide the head-up display with a light sensor, a control unit then controlling the luminosity of the generated image according to a signal acquired by the light sensor so as to match the luminosity of this image to an ambient luminosity.

More particularly, it is known practice to position the light sensor inside a housing of the display. An opening is then made in the display housing so that a portion of the luminous radiation from the outside enters the housing and reaches the light sensor. However, the interior of the display housing is then visible to a user, thus marring the outer appearance of the display.

SUBJECT MATTER OF THE INVENTION

In this context, the present invention provides a display such as defined in the introduction, further comprising a light guide located inside the housing of the display, having an input face and being shaped to collect, at its input face, luminous radiation originating outside the housing of the display, and to guide said luminous radiation to said sensor.

It is advantageous to be able to position the light sensor inside the housing, in particular in order to address mechanical and electrical connection constraints of this sensor.

The light guide advantageously allows the light sensor to be placed inside the display housing without this making the inside of the housing visible to a user, which is particularly advantageous in terms of the outer appearance of the display.

The light guide also allows the luminous radiation originating outside the display housing, and the luminous intensity of which is measured by the light sensor, to be collected effectively.

The display housing has an opening through which said luminous radiation passes in order to reach the light sensor.

According to one optional feature of the display, the input face of the light guide is located at the level of this opening.

The outer appearance of the display is thus advantageously smooth and uniform.

Additionally, the light guide then prevents the ingress of foreign bodies, such as dust particles, into the display housing, and optimally screens the inside of said housing from the view of a user.

According to another optional feature, the display also comprises an optical projection assembly that is suitable for projecting the image generated by the image generation unit in the direction of a semitransparent plate in order to form, with the semitransparent plate, a virtual image in the field of view of the user.

Provision may therefore be made for the light guide to be distinct from the semitransparent plate. Provision may also be made for the light guide to be disjunct from the semitransparent plate.

It is preferable to prevent a portion of the light emitted by the image generation unit, and subsequently partly reflected off the semitransparent plate, from reaching said sensor, since this light would disrupt the ambient luminosity measurement made by this sensor.

Because the light guide is distinct, or even disjunct, from the semitransparent plate, the light emitted by the image generation unit is advantageously prevented from reaching the light sensor.

The applicant has further observed that when the display is fitted to a vehicle, secondary luminous radiation:
- exhibiting sudden and repeated variations in intensity; and
- originating outside the vehicle without however arising from a region located in the field of view of the driver, may be incident on the display.

Such a situation is encountered in particular when the vehicle is traveling through a tunnel provided with lighting devices positioned at regular intervals along the tunnel, or when the vehicle is passing by suspension cables of a bridge or other structural elements positioned alternately along the path of the vehicle.

The variations in the luminous intensity of this secondary luminous radiation are then liable to be detected by the light sensor, then resulting in a parasitic variation, in this instance a flashing, in the luminosity of the image generated by the image generation unit.

In order to overcome this drawback in particular, provision may be made for the light guide to be shaped such that the luminous radiation that it is designed to collect arises from a zone that is located approximately in the direction in which said virtual image is formed.

The luminous radiation, i.e. the light, arising from this zone is perceived by the user when he or she looks in the direction of said virtual image. It is therefore advantageous, by virtue of this light guide, for the sensor to receive at least a portion of the luminous radiation arising from this zone so as to be able to match the luminosity of the virtual image to the luminosity of its visual environment.

The light guide shaped in this way further makes it possible to selectively collect the light arising from this zone by excluding the light arising from other regions of the environment outside the display. By virtue of this selective nature of the light guide, the aforementioned flashing of the image generated by the display is then advantageously limited.

Other nonlimiting and advantageous features of the display according to the invention are the following:
- said zone surrounds said virtual image;
- the input face of the light guide is oriented in such a way as to deflect the luminous radiation arising from said zone by refraction so as to couple said luminous radiation in the light guide;
- the input face of the light guide is curved so as to selectively collect the luminous radiation arising from said zone;
- the input face of the light guide is convex;
- the input face of the light guide is located, with respect to the semitransparent plate, on a side opposite said virtual image;
- the housing has an outer face;
- the housing has a recess at the level of said outer face, the input face of the light guide being located at the level of this recess;
- the housing comprises a wall extending from this outer face in the direction of the inside of the housing;
- the input face of the light guide is located at the level of said wall;
- said wall overhangs said outer face;
- the housing comprises a conduit extending from said outer face toward the inside of the housing, the input face of the light guide being located at the level of this conduit;
- this conduit is provided so as to allow luminous radiation emitted by the image generation unit to pass out of the housing;
- said outer face is located, with respect to the inside of the housing, on one and the same side of the housing as the semitransparent plate in the operating position;
- the light guide is disjunct from said sensor;
- the display is designed such that the luminosity of the generated image increases with the luminous intensity received by said sensor; and
- the display constitutes a head-up display that is intended to be fitted to a vehicle.

DETAILED DESCRIPTION OF ONE EXEMPLARY EMBODIMENT

The following description with reference to the appended drawings, which are provided as nonlimiting examples, will facilitate understanding of the invention and how it may be carried out.

Figure 2:
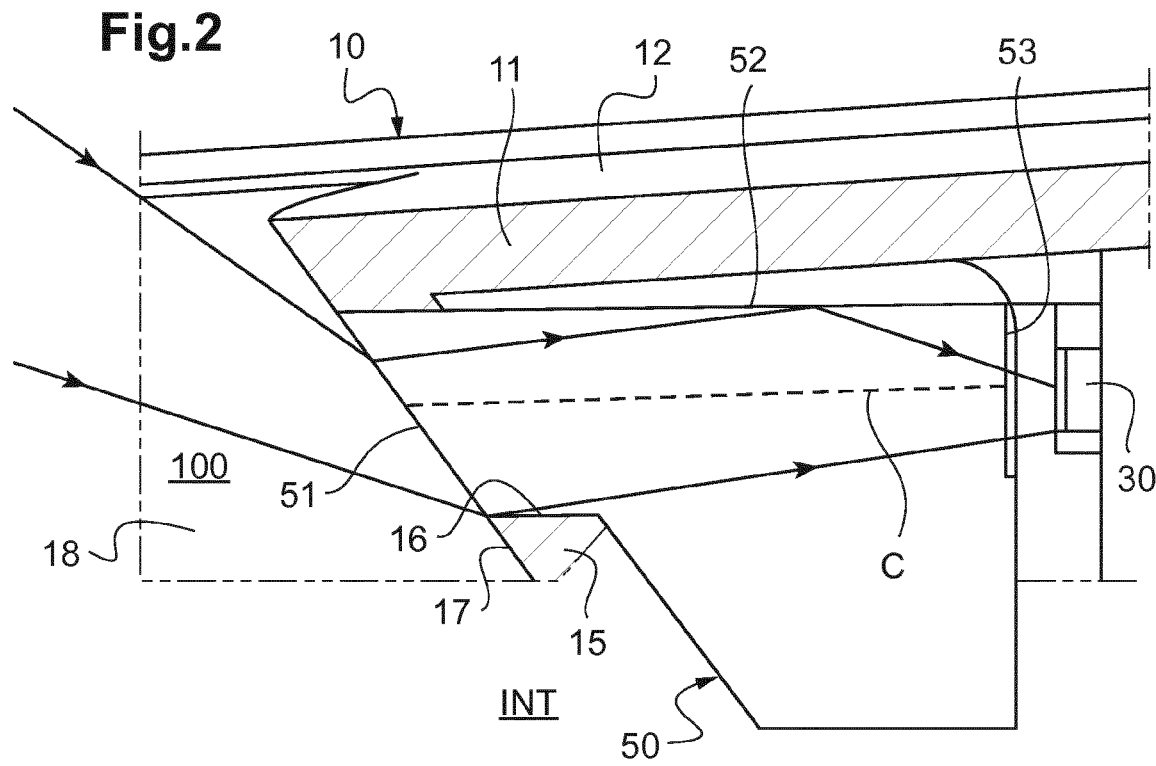

In the appended drawings:

FIG. 1 is a schematic sectional side view of a display implementing the teachings of the invention; and FIG. 2 is a schematic detail view of the zone II from FIG. 1.

FIG. 1 schematically shows the main elements of a display 1, here a head-up display, that is intended to be fitted to a vehicle, for example to a motor vehicle, to a train, to a boat such as a barge, to a tram or to a bus.

The display 1 comprises an image generation unit 20 including for example a backlighting device illuminating a TFT (thin-film transistor) liquid-crystal display (LCD).

Here, the display 1 also comprises an optical projection assembly that is suitable for projecting an image generated by the image generation unit 20 in the direction of a semitransparent plate in order to form, with the semitransparent plate, a virtual image IMV in the field of view of a user. The virtual image IMV reproduces the image generated at the level of the image generation unit 20.

It is thus possible to display information in the field of view of the user without him or her having to avert his or her gaze. In practice, this user corresponds here to the driver of the vehicle.

The optical projection assembly comprises here a folding mirror 60. As a variant, it could comprise a plurality of mirrors and/or other optical elements.

The semitransparent plate is here implemented in the form of a combiner 70, i.e. a semitransparent pane, positioned here between the windshield 2 of the vehicle and the eyes 3 of the driver.

As a variant, it is possible to make provision for the optical projection assembly to directly project the image generated by the image generation unit in the direction of the windshield of the vehicle, the aforementioned combiner then being omitted. In this case, the semitransparent plate is thus implemented in the form of the windshield of the vehicle.

The expression "semitransparent plate" refers here to a plate that is at least partially transparent, exhibiting a level of transparency comprised between that of a completely transparent plate and that of a completely opaque plate.

In addition to being semitransparent, this plate is semireflective, thus making it possible to return at least a portion of the light produced by the image generation unit 20 in the direction of the user, as shown schematically in FIG. 1.

The virtual image IMV, formed in the field of view of the user by the optical projection assembly and the semitransparent plate, is located opposite the user with respect to the semitransparent plate, for example a few meters away from the semitransparent plate.

Here, for the driver of the vehicle, the virtual image IMV is formed within the road environment in front of the vehicle, thus being visually superposed over this environment.

The direction in which the virtual image IMV is formed, i.e. the direction in which the virtual image IMV is located with respect to the display 1, is represented schematically in FIG. 1 by the arrow F1.

The display 1 also comprises a light sensor 30, such as a photodiode or a phototransistor, that is suitable for delivering a signal representative of a luminous intensity that it receives, and is positioned so as to receive luminous radiation originating outside the display 1.

The display 1 is designed such that the luminosity of the image generated by the image generation unit 20 is controlled according to the signal delivered by the light sensor 30.

The luminosity of the generated image may thus be matched to an ambient luminosity, measured by means of the sensor 30, which makes it possible to ensure that the virtual image IMV is visible even under varying ambient luminosity.

More specifically, the display 1 is designed here such that the luminosity of the generated image increases with the luminous intensity received by said sensor 30.

To this end, the display 1 comprises here a control unit 40 that is programmed to control the luminosity of the image generated by the image generation unit 20 according to the signal delivered by this sensor 30. In this instance, the control unit 40 is programmed to control the luminosity of the generated image such that it increases with the luminous intensity received by said sensor 30.

In order to match the luminosity of the generated image in this way, it is envisaged here to control the mean amplitude of an electric current, or of a voltage, supplying power to the backlighting device of the image generation unit 20.

Here, more specifically, the control unit 40 is programmed to modulate the pulse width of an electric current supplying power to the backlighting device of the image generation unit 20, such that the mean intensity (over time) of this electric current increases with the luminous intensity measured by the sensor 30.

The relationship between the luminous intensity measured by the sensor 30 and the corresponding mean intensity of the electric current applied to the backlighting device is for example stored in the form of a lookup table in a memory of the control unit 40.

As a variant, the control unit may be omitted, the image generation unit then being controlled in a comparable manner to that which has been described above, by means of an electronic module external to the display.

The display 1 also comprises a housing 10 in which the image generation unit 20 and the redirecting mirror 60 are housed.

This housing 10, shown partially in FIG. 1, screens the elements of the display 1 that are housed in the housing 10 from the view of the user, by virtue of which the outer appearance of the display is uniform. The housing 10 also protects these elements of the display 1 from foreign bodies such as dust particles.

The housing 10 is formed of a plurality of optically opaque walls 11, 13, 14 that separate the inside INT of the housing 10 from the outside.

The housing 10 comprises in particular an upper main wall 11 that is located on the side of the semitransparent plate in the operating position. In the operating position, the semitransparent plate, here the combiner 70, protrudes out of the housing 10 with respect to this upper main wall 11. This upper main wall 11 is here planar overall.

The term "upper" refers to elements, or portions of elements, of the display that are located, with respect to the housing 10 (more specifically with respect to the inside INT of the housing 10), on one and the same side of the housing as the semitransparent plate in the operating position. Such elements, in particular the upper main wall 11, may thus be visible to the user. In the particular case of the display 1 being installed in the vehicle in proximity to a dashboard thereof (on one side of the windshield 2 opposite a roof of the vehicle), the term "upper" refers to elements, or portions of elements, of the display that are located toward the top of the display 1, relative to an upward vertical direction.

Optionally, it is possible to envisage the combiner 70 being mounted so as to move with respect to the housing 10 between its operating position and a retracted position, the combiner 70 in its retracted position being housed in the housing 10.

The light sensor 30 is also housed in the housing 10 of the display. Here, more specifically, the light sensor 30 is located inside INT the housing, in the vicinity of the upper main wall 11 of the housing mentioned above.

The light sensor 30 is fixedly mounted on a printed circuit support board (not shown). In order to allow a greater degree of freedom in positioning the light sensor 30 within the display, this printed circuit support board is here distinct from another, main printed circuit support board of the display, to which it is connected via an electrical cable. The main printed circuit support board of the display is for example used to mount the control unit 40 and/or the electronic components that are required to generate the electric current (which is pulse-width modulated here) supplying power to the image generation unit 20. The signal delivered by the light sensor 30 is transmitted to the main printed circuit support board by means of the electrical connection mentioned above.

The housing 10 has an opening 16 (visible in FIG. 2) allowing the luminous radiation received by the sensor 30 to pass into INT the housing 10 from the outside.

According to one particularly noteworthy feature, the display 1 also comprises a light guide 50 located inside INT the housing 10 of the display, having an input face 51 and being shaped to collect, at its input face 51, luminous radiation originating outside the housing 10 of the display, and to guide said luminous radiation to said light sensor 30.

This light guide 50 advantageously allows the light sensor 30 to be placed inside INT the housing of the display 1 without however making the inside INT of this housing visible to the user, which is particularly advantageous in terms of the outer appearance of the display 1.

The light guide 50 also allows the luminous radiation originating outside the display housing 10, the luminous intensity of which is measured by the light sensor 30, to be collected effectively.

The light guide 50 is here distinct and disjunct from the semitransparent plate. This prevents the light emitted by the image generation unit 20, and which passes through the semitransparent plate or is reflected thereby, from reaching the light sensor 30. This arrangement is particularly advantageous, since if a portion of the light emitted by the image generation unit were to reach the light sensor 30, this would disrupt the ambient luminosity measurement made by this sensor 30.

The input face 51 of the light guide 50 is located here at the level of the opening 16 made in the housing 10 in order for the luminous radiation to pass through and reach the light sensor 30. More specifically, as may be seen in FIG. 2, the input face 51 of the light guide 50 is here flush with the outer face 17 of the wall 15 of the housing in which this opening 16 is made.

The light guide 50 is here shaped such that the luminous radiation that it is designed to collect arises from a zone Z1 that is located approximately in the direction in which the virtual image IMV is formed.

The direction in which the zone Z1 is located with respect to the display 1 is represented by the arrow F2 in FIG. 1. This direction is close to the direction in which said virtual image IMV is formed.

The zone Z1 may however be slightly angularly offset with respect to the virtual image IMV, for example by an angle comprised between 0° and 45°.

Since the direction in which the zone Z1 is located is close to the direction in which the virtual image IMV is formed, the zone Z1 is located, for the user, in the visual vicinity of the virtual image IMV. Here for example, from a visual point of view, the zone Z1 is located slightly above the virtual image IMV, in the field of view of the user (as illustrated schematically in FIG. 1).

The light arising from this zone Z1 is therefore perceived by the user when he or she looks in the direction of said virtual image IMV.

By virtue of the light guide 50, at least a portion of the luminous radiation arising from this zone Z1 reaches the light sensor 30. The light guide 50 further prevents the light arising from other regions of the environment outside the display 1 from reaching the light sensor 30.

By virtue of this arrangement, the luminosity of the virtual image IMV is therefore adjusted according to the luminosity of the zone Z1, which is located visually in the vicinity of this image IMV. This arrangement is therefore particularly advantageous, since it provides optimal visibility of the virtual image IMV for the user.

Optionally, it is also possible to envisage the zone Z1 not only being located in a direction close to that in which the virtual image IMV is formed, but this zone Z1 additionally surrounding said virtual image IMV. In other words, it is possible to envisage the zone Z1 being located, in the environment in front of the user, around the virtual image IMV.

The ability of the light guide 50 to selectively collect the luminous radiation arising from the zone Z1 is achieved in particular by virtue of the light guide 50 being suitably positioned, which is described in greater detail below.

To this end, it is possible to envisage, like here, the housing 10 having an outer face 12 and having a recess 100 at the level of this outer face 12, the input face 51 of the light guide 50 being located at the level of this recess 100. In other words, it is possible to envisage the housing 10 having, at the level of this outer face 12, a portion that is set back (said recess) with respect to this outer face, forming a cavity or a conduit. The input face 51 of the light guide 50, located at the level of this recess 100 (set back with respect to the outer face 12 of the 1 housing 10 of the display), is then at least partly sheltered from luminous radiation, other than that arising from the zone Z1, surrounding the display.

In order to strengthen this effect further, it is possible to envisage, like here, the wall 15, at the level of which the input face 51 of the light guide is located, extending into INT the housing 10 and overhanging said outer face 12 of the housing, i.e. forming, with the outer face 12, an acute angle of less than 90°. The outer face 12 of the housing then extends, with respect to the inside INT of the housing 10, over the input face 51 of the light guide and thus partly shelters it from the abovementioned luminous radiation.

The input face 51 of the light guide 50 is located here more specifically on said wall 15, in proximity to the outer face 12 of the display housing, as illustrated in FIG. 2.

Here, the display 1 also comprises a conduit 19 (FIG. 1) extending from the outer face 12 of the housing in the direction of the inside INT of the housing 10. This conduit 19 opens onto the outer face 12 of the housing 10. This conduit 19 channels luminous radiation that is emitted by the image generation unit 20 and sent to the combiner 70 by the optical projection assembly in order to form the virtual image IMV.

The conduit 19 is formed of a plurality of optically opaque walls 15, 15', 18. It prevents in particular parasitic luminous radiation, other than that intended to form the virtual image IMV, from escaping from the display housing.

The wall 15 mentioned above, at the level of which the input face 51 of the light guide 50 is located, corresponds here to one of the walls 15, 15', 18 forming this conduit 19.

Furthermore, the aforementioned outer face 12 is located here, with respect to the inside INT of the housing 10, on one and the same side of the housing 10 as the semitransparent plate 70 in the operating position. More specifically, this outer face 12 is embodied here by the upper main wall 11 of the housing 10.

The input face 51 of the light guide 50 is then positioned particularly suitably, from an optical point of view, for collecting the light originating in a direction close to the direction in which the virtual image IMV is formed while being optimally sheltered from other luminous radiation.

In this configuration, the input face 51 of the light guide 50 is then located, with respect to the semitransparent plate, on a side opposite the virtual image IMV.

The light guide 50, positioned as described above, may now be described in greater detail.

The luminous radiation arising from the zone Z1 follows, through the light guide 50, a mean propagation path c that connects the input face 51 of the light guide to an output face 53 that is located facing the light sensor 30.

The input face 51 of the light guide 50 is here oriented in such a way as to deflect this luminous radiation by refraction so as to couple it in the light guide 50. In other words, the light guide 50 is here oriented in such a way as to modify the mean direction of propagation of this radiation by refraction so that it coincides in the light guide with that defined by the propagation path c.

This deflection by refraction is achieved by means of the input face 51 being suitably inclined with respect to the direction in which the zone Z1 is located.

In order to allow this deflection by refraction, the input face 51 is oriented obliquely, also with respect to the direction defined by the propagation path c (at the level of the input face 51 of the light guide). The light guide 50 thus takes a beveled shape at the level of its input face 51.

The propagation path c is here approximately rectilinear. Thus, the input face 51 of the light guide is oriented such that more specifically, here, it deflects the luminous radiation arising from said zone Z1 by refraction in the direction of the light sensor 30.

In one variant (not shown), it is possible to envisage the input face of the light guide being approximately perpendicular to the direction in which the zone Z1 is located when seen from the input face 51, instead of being oriented obliquely with respect to this direction as in the embodiments described above. According to this variant, when entering the light guide, the light arising from this zone Z1 would then not, on average, be deflected. In the context of this variant, the propagation path then extends from the input face of the light guide in a direction that is substantially parallel to that in which the zone Z1 is located when seen from the input face 51.

Optionally, it is possible to envisage the input face 51 being curved in order to increase the collection selectivity and effectiveness of the light guide 50. The input face 51 may in particular be convex so as to perform the optical function of a convergent lens.

The output face 53 is approximately planar and orthogonal to the propagation path C.

The light sensor 30 is here positioned in proximity to the upper main wall 11 of the housing (on the inside of the housing), in the same way as the input face 51 of the light guide, such that the abovementioned propagation path C is approximately parallel to this upper main wall 11 of the housing.

The sensitive surface of the sensor 30 extends here approximately perpendicularly to this upper main wall 11.

The light guide 50 also has, here, an upper face 52 connecting its input face 51 and its output face 53 and extending approximately in parallel to the propagation path C. This upper face 52 performs a function of guiding, by total internal reflection, the luminous radiation collected by the light guide 50. To this end, the upper face 52 is polished.

The input 52 and output 53 faces, as well as the other faces of the light guide 50, are also polished.

The light guide 50 is for example produced by injecting a transparent plastic material such as transparent polycarbonate or transparent poly(methylmethacrylate) (PMMA) into a mold.

The output face 53 of the light guide 50 is here disjunct from the light sensor 30, a thin gap being provided between the sensor 30 and the output face 53. This arrangement advantageously prevents vibrations or mechanical stresses from being transmitted between the light guide 50 and the sensor 30.

The invention claimed is:

1. A display comprising:
a housing;
an image generation unit configured to generate an image;
a light sensor, arranged inside said housing, that delivers a signal that is representative of a luminous intensity that the light sensor receives, and
a light guide located inside the housing of the display, having an input face and shaped to collect, at the input face, luminous radiation that passes through a zone that contains the image that originates outside the housing of the display, and shaped to guide said luminous radiation to said light sensor;
wherein the display is configured such that a luminosity of the image generated by the image generation unit is controlled according to said signal.

2. The display as claimed in claim 1, wherein said housing has an opening through which said luminous radiation passes, the input face of the light guide being located at a level of this opening.

3. The display as claimed in claim 1,
comprising an optical projection assembly for projecting the image generated by the image generation unit in a direction of a semitransparent plate in order to form, with the semitransparent plate, a virtual image in a field of view of a user, and
wherein the light guide is distinct from the semitransparent plate.

4. The display as claimed in claim 3, wherein said zone surrounds said virtual image.

5. The display as claimed in claim 3, wherein the input face of the light guide is located, with respect to the semitransparent plate, on a side opposite said virtual image.

6. The display as claimed in claim 1, wherein the input face of the light guide is oriented to deflect the luminous radiation arising from said zone by refraction so as to couple said luminous radiation in the light guide.

7. The display as claimed in claim 1, wherein the input face of the light guide is curved so as to selectively collect the luminous radiation arising from said zone.

8. The display as claimed in claim 1, wherein the housing has an outer face and has a recess at a level of this outer face, the input face of the light guide being located at a level of this recess.

9. The display as claimed in claim 8, wherein said outer face is located, with respect to an inside of the housing, on a same side of the housing as a semitransparent plate in an operating position.

10. The display as claimed in claim 1, wherein, the housing having an outer face, the housing comprises a wall extending from this outer face in a direction of an inside of the housing and overhanging said outer face, the input face of the light guide being located at a level of said wall.

11. The display as claimed in claim 1, wherein, the housing having an outer face, the housing comprises a conduit extending from said outer face toward an inside of the housing to allow luminous radiation emitted by the image generation unit to pass out of the housing, the input face of the light guide being located at a level of this conduit.

12. The display as claimed in claim 1, wherein the light guide is disjunct from said light sensor.

13. The display as claimed in claim 1, wherein the luminosity of the image increases with the luminous intensity received by said light sensor.

\* \* \* \* \*